(12) United States Patent  
Andou

(10) Patent No.: US 7,304,379 B2  
(45) Date of Patent: Dec. 4, 2007

(54) SEMICONDUCTOR DEVICE WITH PIPE FOR PASSING REFRIGERANT LIQUID

(75) Inventor: Katsuji Andou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 273 days.

(21) Appl. No.: 10/759,198

(22) Filed: Jan. 20, 2004

(65) Prior Publication Data

US 2005/0046020 A1   Mar. 3, 2005

(30) Foreign Application Priority Data

Aug. 27, 2003 (JP) .............................. 2003-302343

(51) Int. Cl.
  *H01L 23/34* (2006.01)
(52) U.S. Cl. ............................ 257/714; 257/E23.088
(58) Field of Classification Search ............... 257/675, 257/712–718, 728, 720–722, E23.088
See application file for complete search history.

(56) References Cited

U.S. PATENT DOCUMENTS

| 4,079,410 | A | * | 3/1978 | Schierz ..................... 257/714 |
| 4,727,455 | A | * | 2/1988 | Neidig et al. ............. 361/700 |
| 5,172,213 | A | * | 12/1992 | Zimmerman ............ 257/796 |
| 5,606,201 | A | * | 2/1997 | Lutz ......................... 257/714 |
| 5,780,928 | A | * | 7/1998 | Rostoker et al. ........ 257/713 |
| 5,869,883 | A | * | 2/1999 | Mehringer et al. ...... 257/667 |
| 5,950,714 | A | * | 9/1999 | Schneider et al. ....... 165/80.3 |
| 6,397,935 | B1 | * | 6/2002 | Yamamoto et al. ..... 165/104.26 |
| 6,670,699 | B2 | * | 12/2003 | Mikubo et al. .......... 257/678 |
| 2002/0185726 | A1 | * | 12/2002 | North et al. ............. 257/707 |

FOREIGN PATENT DOCUMENTS

| JP | 62-108560 | 5/1987 |
| JP | 02-146844 | 12/1990 |
| JP | 04-214658 | 8/1992 |
| JP | 10-92991 | 4/1998 |
| JP | 2001-332679 | 11/2001 |
| JP | 2002-93974 | 3/2002 |
| JP | 2002-270736 | 9/2002 |
| JP | 2002-270748 | 9/2002 |
| JP | 2005-12163 | 1/2005 |
| WO | WO 9009037 A1 * | 8/1990 |

* cited by examiner

*Primary Examiner*—Thao X. Le  
(74) *Attorney, Agent, or Firm*—Oblon, Spivak, McClelland, Maier & Neustadt, P.C.

(57) ABSTRACT

A semiconductor device includes 1) a conductive pipe including an inner surface forming an inner space shaping a path of an insulative cooling refrigerant liquid and an outer surface including a plane potion partially formed thereof, 2) a power semiconductor element fixed onto the plane portion of the conductive pipe through a bonding layer such as solder, 3) a first external connecting terminal including an inner lead part including a tip portion bonded onto the plane portion of the conductive pipe and an outer lead part continuous with the inner lead part, 4) a second external connecting terminal which is in the state of floating above the outer surface, and 5) a mold resin covering the whole surface of the power semiconductor element, the whole of the inner lead parts of the external connecting terminals, and the whole of the outer surface covering a central portion of the conductive pipe.

2 Claims, 3 Drawing Sheets

SEMICONDUCTOR DEVICE WITH PIPE FOR PASSING REFRIGERANT LIQUID

BACKGROUND OF THE INVENTION

1. Field of the Invention

The present invention relates to a cooling technique of a power semiconductor device.

2. Description of the Background Art

In order to dissipate heat generated from a power semiconductor element to the exterior, a conventional power semiconductor device has a copper plate bonded to a back surface of the power semiconductor element with a brazing material and a ceramic plate bonded to the copper plate with a brazing material provided therein, a back surface of the ceramic plate being in contact with an external cooling system (a cooling plate having a path for passing a refrigerant liquid therein) through adhesion grease. The conventional power semiconductor device is disclosed in Japanese Patent Application Laid-Open Nos. 2002-270748, 2002-093974 and 2001-332679.

In the conventional semiconductor device, members for the copper plate and the ceramic plate need to be used to attach the cooling system to the semiconductor device, and grease needs to be coated at the time of the attachment to ensure a contact surface and reduce contact thermal resistance. This sort of structure has been an obstacle in seeking size reduction of the device while further increasing the cooling efficiency to heat generated from the power semiconductor element.

SUMMARY OF THE INVENTION

The present invention has been made for the purpose of solving the aforementioned technical issues, and it is an object of the present invention to attain performance improvement and size reduction concurrently in a semiconductor device provided with a cooling system.

A semiconductor device according to the present invention includes a conductive pipe, a power semiconductor element, an external connecting terminal, and a mold resin.

The conductive pipe includes an inner surface forming an inner space shaping a path of a refrigerant liquid and an outer surface including a plane partially formed thereof. The power semiconductor element is fixed onto the plane in the outer surface of the conductive pipe through a bonding layer. The external connecting terminal includes an inner lead part including a tip portion bonded onto the plane in the outer surface of the conductive pipe and an outer lead part continuous with the inner lead part. The mold resin covers the whole surface of the power semiconductor element, the whole of the inner lead part of the external connecting terminal, and the outer surface of the conductive pipe.

According to the semiconductor device of the present invention, 1) performance improvement (an increase in the amount of a conducting current) of the device may be realized because the power semiconductor element which is a heat source may be cooled directly within the semiconductor device, and 2) reduction in size and cost of the device may also be realized because the conductive pipe can serve both as a cooling path and a conducting path.

These and other objects, features, aspects and advantages of the present invention will become more apparent from the following detailed description of the present invention when taken in conjunction with the accompanying drawings.

DESCRIPTION OF THE PREFERRED EMBODIMENTS

Various embodiments of the subject matter of the present invention will now be described in detail together with their effects and advantages with reference to the drawings.

First Preferred Embodiment

Figure 1:
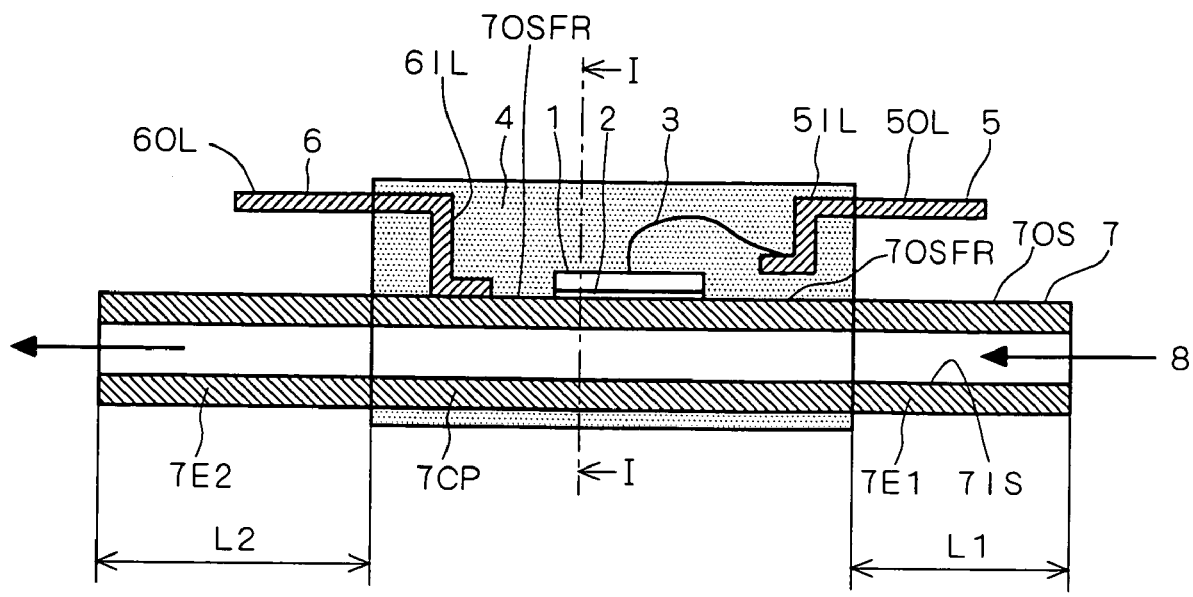
FIG. 1 is a vertical sectional view of a structure of a semiconductor device according to a first preferred embodiment of the present invention.
Figure 2:
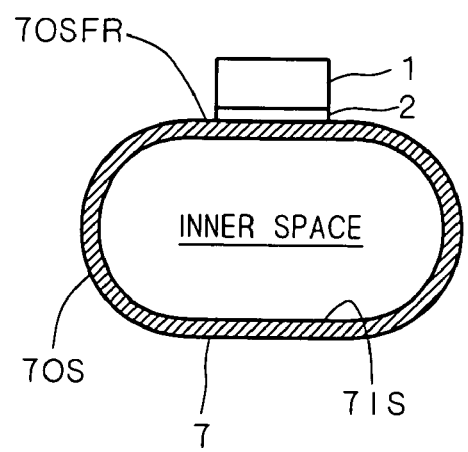
FIG. 2 is a vertical sectional view of a pipe taken along the line I-I of FIG. 1.

FIG. 1 is a vertical sectional view of a structure of a power semiconductor device according to the present preferred embodiment. FIG. 2 is a view showing a part in an enlarged manner of a vertical sectional structure taken along the line I-I of FIG. 1.

In FIGS. 1 and 2, a conductive pipe 7 is made of a conductive material (a metal body, an alloy and the like), which is a thin conductive tubular body (a metallic pipe and the like) including 1) an inner surface 7IS forming an inner space shaping a path of an insulative cooling refrigerant liquid 8, and 2) an outer surface 7OS having a plane (also referred to as a plane portion or a plane region) 7OSFR partially formed thereof. A vertical section of the conductive pipe 7 can take an arbitrary shape, and the plane portion 7OSFR may be formed by, for example, pressing a portion of an outer surface having a vertical section of a round shape of a conductive pipe with a press.

A power semiconductor element or power semiconductor chip 1 is fixed onto a portion (a first region) in the plane region 7OSFR of the outer surface 7OS covering a central portion 7CP of the conductive pipe 7 through a welding brazing material 2 (corresponding to a conductive bonding layer) such as solder.

A first external connecting terminal 6 includes 1) an inner lead part 6IL including a tip portion directly bonded onto another portion (a second region) in the plane region 7OSFR of the outer surface 7OS covering the central portion 7CP of the conductive pipe 7 by welding with a brazing material (a conductive bonding layer: not shown) such as solder or ultrasonic welding, and 2) an outer lead part 6OL continuous with the inner lead part 6IL.

On the other hand, a second external connecting terminal 5 includes 1) an inner lead part 5IL which is located in the state of floating above the outer surface 7OS of the conductive pipe 7 and has a tip portion electrically connected to an upper surface side electrode (not shown) of the power semiconductor element 1 through a wire 3, and 2) an outer lead part 5OL continuous with the inner lead part 5IL.

By using the transfer mold process known in the art, the whole surface of the power semiconductor element 1, the whole surface of the welding brazing material 2, the whole of the inner lead part 6IL of the first external connecting terminal 6, the whole of the outer surface 7OS covering the central portion 7CP of the conductive pipe 7, the whole of the wire 3, and the whole of the inner lead part 5IL of the second external connecting terminal 5 are covered or sealed with a mold resin or a sealing resin 4. Consequently, the inner lead part 5IL of the second external connecting terminal 5 is integrated into the central portion 7CP of the conductive pipe 7 with space therebetween by the mold resin 4. A first end portion (an inlet side end portion) 7E1 and a second end portion (an outlet side end portion) 7E2 of the conductive pipe 7 project from side surfaces of the mold resin 4, while the outer lead parts 6OL and 5OL of the first and second external connecting terminals 6 and 5, respectively, totally project from the side surfaces of the mold resin 4.

The plane portion 7OSFR may be formed only on the central portion 7CP of the conductive pipe 7, or alternatively, on the central portion 7CP as well as either or both of the first and second end portions 7E1 and 7E2.

As described above, in the device according to the present preferred embodiment, the conductive pipe 7, the central portion 7CP thereof in particular, serves not only as a refrigerant path of the refrigerant liquid 8 for directly cooling the power semiconductor element 1, but as a conducting path for directly conducting the power semiconductor element 1 and the external connecting terminal 6 which is one of the two external connecting terminals.

Thanks to the aforementioned structure, the device according to the present preferred embodiment has the following advantages: 1) performance improvement (an increase in the amount of a conducting current) of the semiconductor device may be realized because the power semiconductor element 1 which is a heat source of the device may be cooled directly by the conductive pipe 7, and 2) reduction in cost and size of the semiconductor device itself may also be realized because an external cooling plate and radiation components (a copper plate and a ceramic plate) of a semiconductor device used in the conventional device become unnecessary, and the conductive pipe 7 itself can be used as a conducting path (a cooling path and a conducting path are combined). Additionally, according to this device, 3) flexibility in designing the external connecting terminal 6 which is one of the two external connecting terminals may be increased with the combined use of the cooling path and the conducting path.

First Modification

The present modification is an improvement of the semiconductor device according to the first preferred embodiment. The features of this device are that 1) the conductive pipe 7 further includes an insulating film 10 formed on the whole of the inner surface 7IS, 2) the mold resin 4 covers the whole of the conductive pipe 7, and 3) the mold resin 4 includes a refrigerant liquid inlet 6EN continuous with one end portion of the conductive pipe 7 and a refrigerant liquid outlet 6EX continuous with the other end portion of the conductive pipe 7. Those features will now be described in detail with reference to the drawing.

Figure 3:
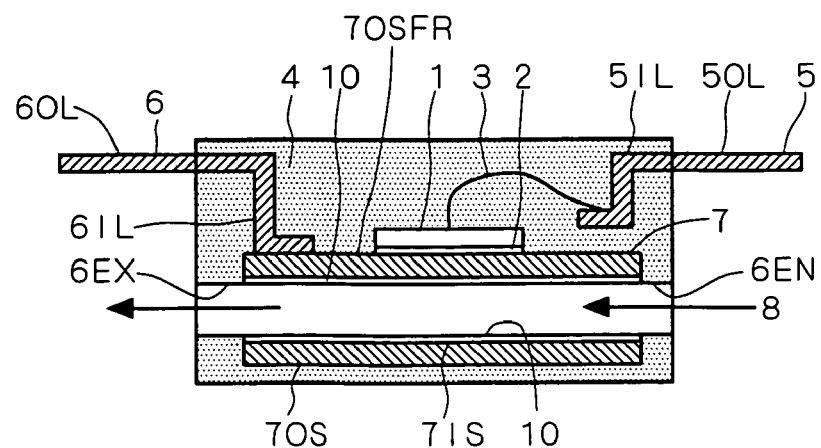
FIG. 3 is a vertical sectional view of a structure of a semiconductor device according to a modification of the first preferred embodiment.

FIG. 3 is a vertical sectional view of a structure of a semiconductor device according to the present modification. The structure shown in FIG. 3 differs from that shown in FIG. 1 in the following respects. Namely, the whole of the conductive pipe 7 is buried in the mold resin 4 by the transfer mold process. Additionally, two holes are formed in side surfaces of the mold resin 4 having been molded by a molding box used for the transfer mold process. One of the holes is the refrigerant liquid inlet 6EN continuous with one end portion of the conductive pipe 7 within the mold resin 4, and the other is the refrigerant liquid outlet 6EX continuous with the other end portion of the conductive pipe 7 within the mold resin 4. Moreover, the insulating film 10 is formed on the whole of the inner surface 7IS of the conductive pipe 7 buried in the mold resin 4. Such a structure sufficiently ensures insulation between the conductive pipe 7 and the exterior of the mold resin 4. Therefore, in the present modification, it is possible to use a conductive liquid such as water (tap water and the like) as the cooling refrigerant liquid 8 to be passed through the inner space enclosed with the insulating film 10 of the conductive pipe 7. Stated another way, the present modification has the advantage of being able to use an inexpensive, environmentally friendly substance as the cooling refrigerant liquid 8 (improvement in environmental friendliness).

Second Preferred Embodiment

Figure 4:
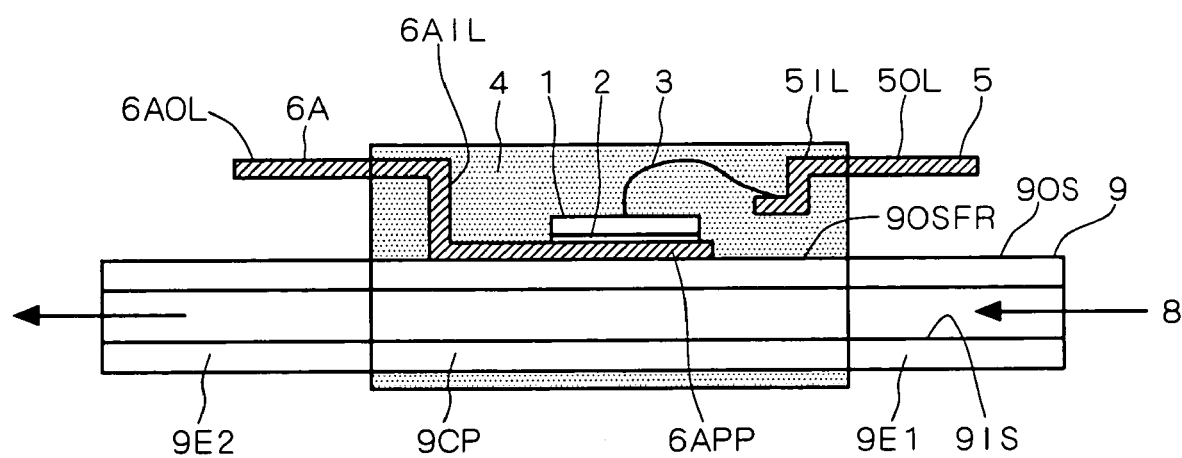
FIG. 4 is a vertical sectional view of a structure of a semiconductor device according to a second preferred embodiment of the invention.

FIG. 4 is a vertical sectional view of a structure of a power semiconductor device according to the present preferred embodiment. One of the features which structurally distinguishes the present device from the device shown in FIG. 1 according to the first preferred embodiment is that A) an insulative pipe 9 is used instead of the conductive pipe 7, which includes an inner surface 9IS forming an inner space shaping a path of the cooling refrigerant liquid 8 (which may be an insulative substance, or alternatively, a conductive substance such as inexpensive water) and an outer surface 9OS having a plane region 9OSFR partially formed thereof. The plane portion 9OSFR may be formed on a central portion 9CP as well as either or both of end portions 9E1 and 9E2. Thanks to this structure, B) a first external connecting terminal 6A includes an inner lead part 6AIL including a pad part 6APP bonded onto the plane 9OSFR of the insulative pipe 9 and an outer lead part 6AOL continuous with the inner lead part 6AIL. Additionally, C) the power semiconductor element 1 is fixed onto the pad part 6APP of the first external connecting terminal 6A through the welding brazing material (a bonding layer) 2. Accordingly, the power semiconductor element 1 is cooled indirectly by the pipe 9 forming the refrigerant path through the pad part 6APP. The other constituent elements 3 are 5 are the same as the corresponding ones in FIG. 1. Finally, D) by using the transfer mold process, the whole surface of the power semiconductor element 1, the whole surface of the welding brazing material 2, the whole of the inner lead parts 6AIL and 5IL of the first and second external connecting terminals 6 and 5, respectively, the whole of the wire 3, and the whole of the outer surface 9OS covering the central portion 9CP of the insulative pipe 9 are entirely covered with the mold resin 4.

According to the semiconductor device of the present preferred embodiment, 1) it is possible to efficiently cool the power semiconductor element 1 which is a heat source, and 2) a semiconductor device which is smaller than a conventional one may be obtained because an external cooling plate and radiation components (a copper plate and a ceramic plate) of a semiconductor device used in a conventional device are eliminated.

Figure 5:
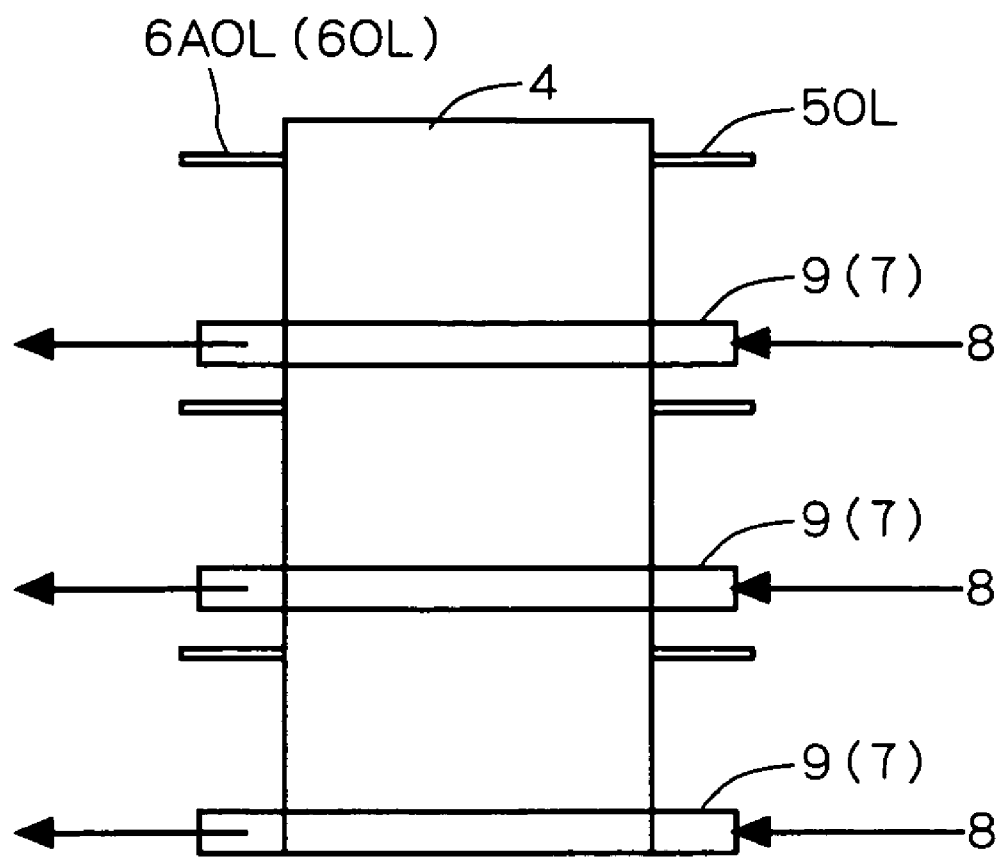
FIG. 5 is a vertical sectional view of a structure of a semiconductor device according to a modification of the second (or first) preferred embodiment.

Alternatively, as illustrated in FIG. 5, plural power semiconductor devices shown in FIG. 4 (or in the aforementioned FIG. 1) may be arranged adjacently to each other along the vertical direction (the vertical direction in the plane of the drawing). Through the adoption of the configuration shown in FIG. 5, a semiconductor device having an increased packaging density may be obtained.

Second Modification

A pipe having a vertical section of a more rectangular shape than the original one may be used as the insulative pipe 9 in FIG. 4. The adoption of such a pipe negates the process (a pressing process and the like) of forming the outer surface of the pipe to have a partially plane shape, making it easier to manufacture the semiconductor device.

As the power semiconductor element 1 in each of the above preferred embodiments and modifications, a semiconductor chip, typically an IGBT or a vertical MOSFET, can be given as an example.

Addition

The central portion 7CP or 9CP is defined as a part of the pipe 7 or 9 of which the outer surface is entirely covered with the resin 4, and is a relative concept. Accordingly, the length L1 of the first end portion 7E1 (or 9E1) in a longitudinal direction thereof is not necessarily equal to the length L2 of the second end portion 7E 2 (or 9E2) in the longitudinal direction (L1=L2 or L1≠L2).

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
a conductive pipe including an inner surface forming an inner space shaping a path of a refrigerant liquid and an outer surface including a plane partially formed thereof;
a power semiconductor element fixed onto said plane in said outer surface of said conductive pipe through a bonding layer;
an external connecting terminal including an inner lead part including a tip portion bonded onto said plane in said outer surface of said conductive pipe and an outer lead part continuous with said inner lead part, said tip portion being disposed onto said plane away from said power semiconductor element and said bonding layer thereof; and
a mold resin covering the whole surface of said power semiconductor element, the whole of said inner lead part of said external connecting terminal, and said outer surface of said conductive pipe;
wherein the power semiconductor element is electrically connected to the inner lead part of the external connecting terminal via the conductive pipe, and the conductive pipe is configured to provide current to the power semiconductor element.
2. The semiconductor device according to claim 1, wherein said conductive pipe further includes an insulating film formed on the whole of said inner surface, and said mold resin covers the whole of said conductive pipe, and includes a refrigerant liquid inlet continuous with one end portion of said conductive pipe and a refrigerant liquid outlet continuous with the other end portion of said conductive pipe.

* * * * *